United States Patent
Koui et al.

(10) Patent No.: US 10,783,947 B2
(45) Date of Patent: Sep. 22, 2020

(54) MAGNETIC MEMORY DEVICE

(71) Applicant: Kabushiki Kaisha Toshiba, Tokyo (JP)

(72) Inventors: Katsuhiko Koui, Kanagawa (JP);
Hiroaki Yoda, Kanagawa (JP);
Tomoaki Inokuchi, Kanagawa (JP);
Naoharu Shimomura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/118,937

(22) Filed: Aug. 31, 2018

(65) Prior Publication Data
US 2019/0287597 A1 Sep. 19, 2019

(30) Foreign Application Priority Data
Mar. 19, 2018 (JP) .................................. 2018-051724

(51) Int. Cl.
*G11C 11/16* (2006.01)
*H01L 43/02* (2006.01)
(Continued)

(52) U.S. Cl.
CPC ........ *G11C 11/1675* (2013.01); *G11C 11/161* (2013.01); *H01L 27/228* (2013.01);
(Continued)

(58) Field of Classification Search
CPC .................................................. G11C 11/1675
See application file for complete search history.

(56) References Cited

U.S. PATENT DOCUMENTS 9,281,040 B2    3/2016  Soree et al.
10,447,277 B1 *  10/2019  Kazemi .................. H01L 43/02
(Continued)

FOREIGN PATENT DOCUMENTS

JP       2017-59594 A    3/2017
JP       2017-85084 A    5/2017
WO    WO 2017/208880 A1  12/2017

OTHER PUBLICATIONS

Shirotori et al., "Voltage-Control Spintronics Memory With a Self-Aligned Heavy-Metal Electrode," IEEE Transactions on Magnetics, vol. 53, No. 11 (Nov. 2017), 4 pages.
(Continued)

*Primary Examiner* — Douglas King
(74) *Attorney, Agent, or Firm* — Finnegan, Henderson, Farabow, Garrett & Dunner, L.L.P.

(57) ABSTRACT

According to one embodiment, a magnetic memory device includes a first member, a first memory cell, and a controller. The first member includes first, second, and third regions. The first memory cell includes first and second magnetic layers, and a first nonmagnetic layer. The second magnetic layer is provided between the third region and the first magnetic layer. The first nonmagnetic layer is provided between the first and second magnetic layers. The controller is electrically connected to the first and second regions, and the first magnetic layer. The controller programs first information to the first memory cell by setting the first magnetic layer to a first electric potential. The controller programs second information to the first memory cell by setting the first magnetic layer to a second electric potential. The second electric potential is different from the first electric potential. The second information is different from the first information.

12 Claims, 11 Drawing Sheets

(51) Int. Cl.
    *H01L 27/22* (2006.01)
    *H01L 43/10* (2006.01)
(52) U.S. Cl.
    CPC .............. *H01L 43/02* (2013.01); *H01L 43/10* (2013.01); *G11C 11/1673* (2013.01)

(56) References Cited

U.S. PATENT DOCUMENTS

| | | | |
|---|---|---|---|
| 2012/0088125 A1* | 4/2012 | Nishiyama | B82Y 25/00 428/828 |
| 2014/0056060 A1* | 2/2014 | Khvalkovskiy | H01L 27/228 365/158 |
| 2014/0160835 A1 | 6/2014 | Soree et al. | |
| 2016/0064650 A1* | 3/2016 | Wang | H01L 27/228 257/427 |
| 2016/0142012 A1* | 5/2016 | Wang | H03B 15/006 331/94.1 |
| 2016/0225423 A1* | 8/2016 | Naik | H01L 43/08 |
| 2017/0076769 A1 | 3/2017 | Shirotori et al. | |
| 2017/0076772 A1 | 3/2017 | Andrikopoulos et al. | |
| 2017/0169872 A1* | 6/2017 | Yoda | G11C 11/1675 |
| 2018/0166500 A1* | 6/2018 | Wang | H03K 19/177 |
| 2018/0190902 A1* | 7/2018 | Garello | H01L 27/226 |
| 2019/0051815 A1* | 2/2019 | Kakinuma | G11C 11/18 |
| 2019/0288031 A1* | 9/2019 | Satoh | G11C 11/1675 |

OTHER PUBLICATIONS

Kondou et al., "Fermi-level-dependent charge-to-spin current conversion by Dirac surface states of topological insulators," Nature Physics, 12:1027-32 (Nov. 2016; published online Jul. 25, 2016).

* cited by examiner

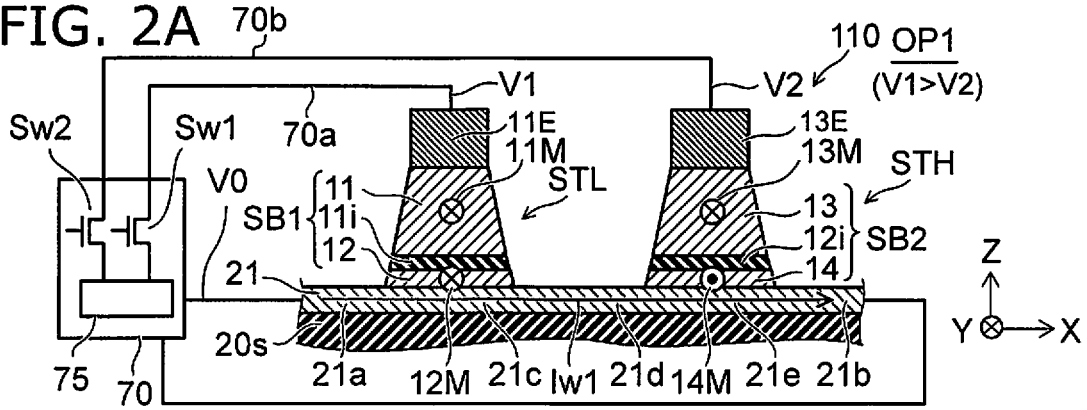
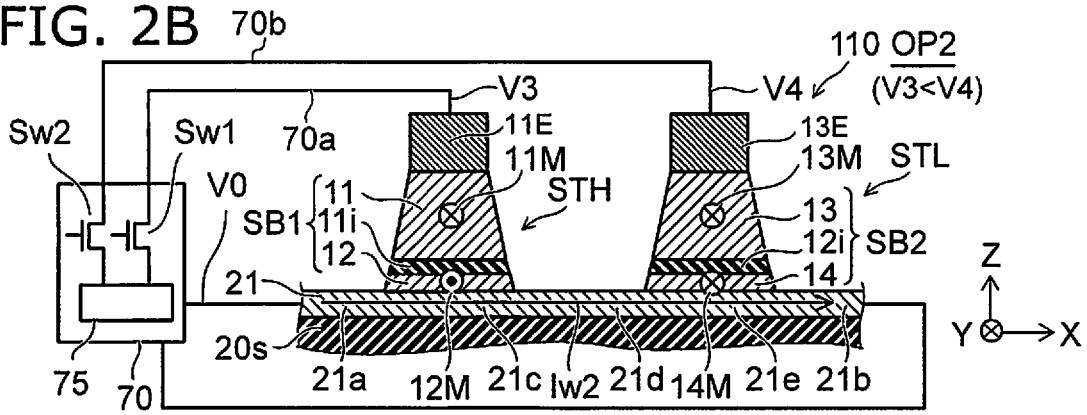
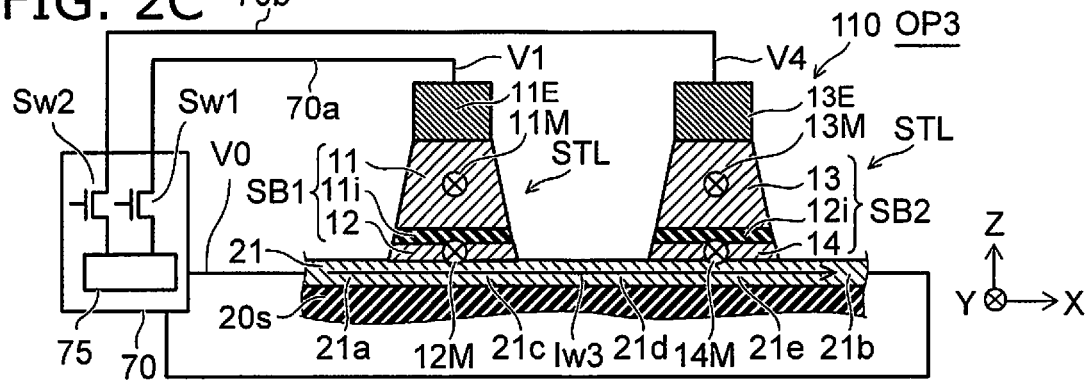
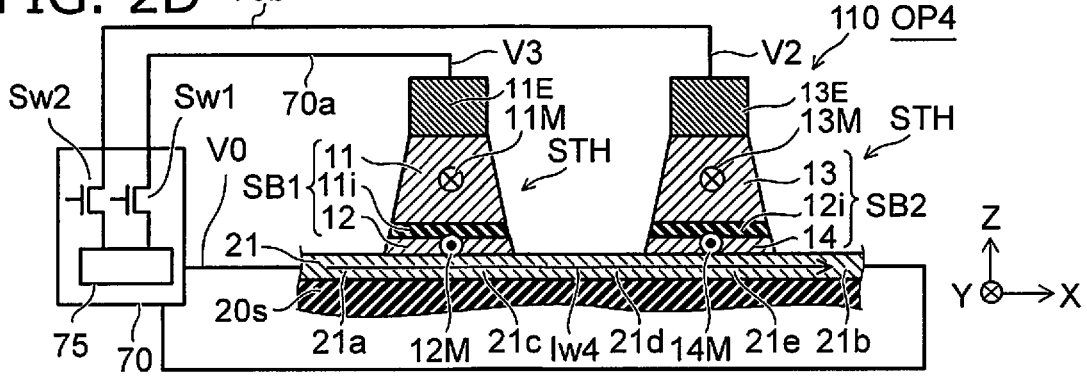

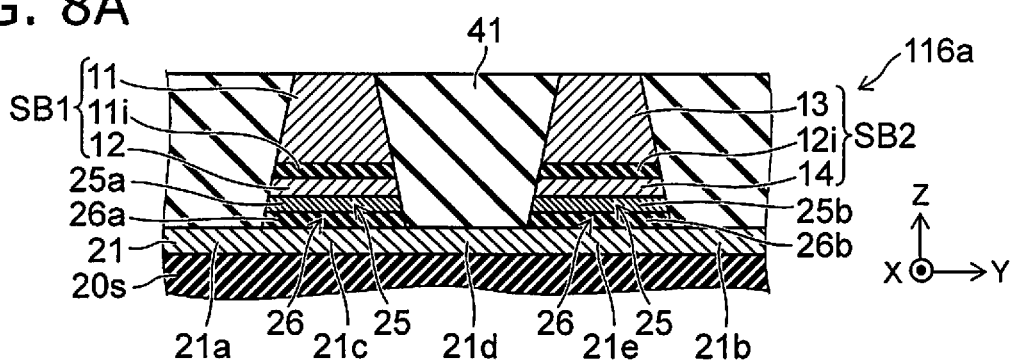
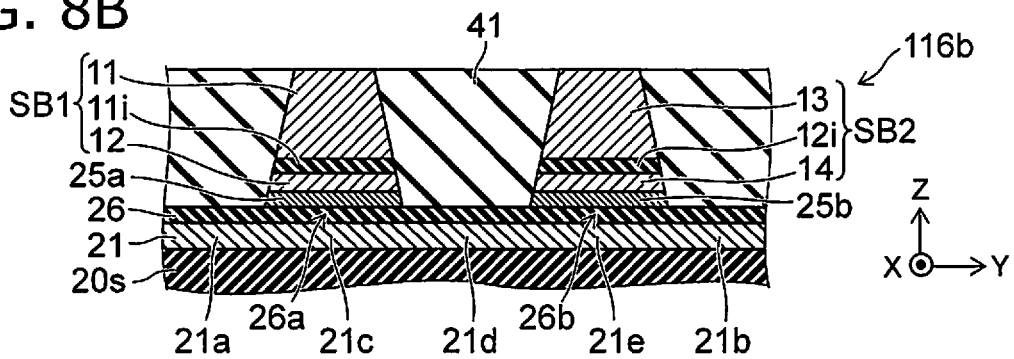
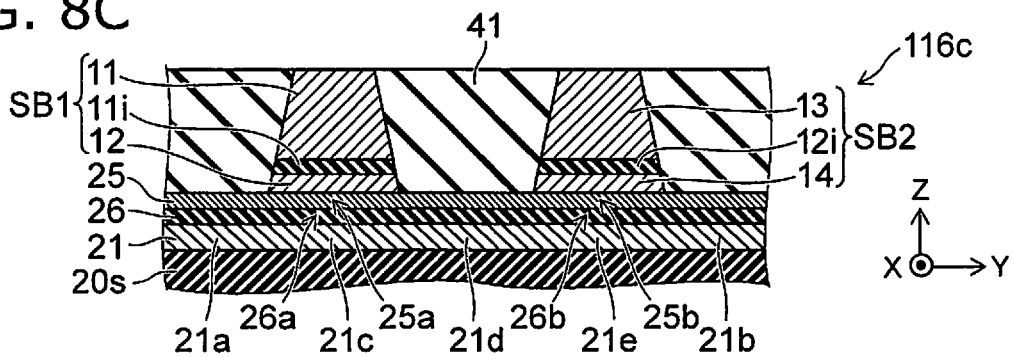

MAGNETIC MEMORY DEVICE

CROSS-REFERENCE TO RELATED APPLICATIONS

This application is based upon and claims the benefit of priority from Japanese Patent Application No. 2018-051724, filed on Mar. 19, 2018; the entire contents of which are incorporated herein by reference.

FIELD

Embodiments described herein relate generally to a magnetic memory device.

BACKGROUND

Stable operations are desirable in a magnetic memory device.

BRIEF DESCRIPTION OF THE DRAWINGS

FIG. 2A to FIG. 2D are schematic views illustrating the magnetic memory device according to the first embodiment;

FIG. 8A to FIG. 8C are schematic cross-sectional views illustrating magnetic memory devices according to the first embodiment;

DETAILED DESCRIPTION

Figure 1A:
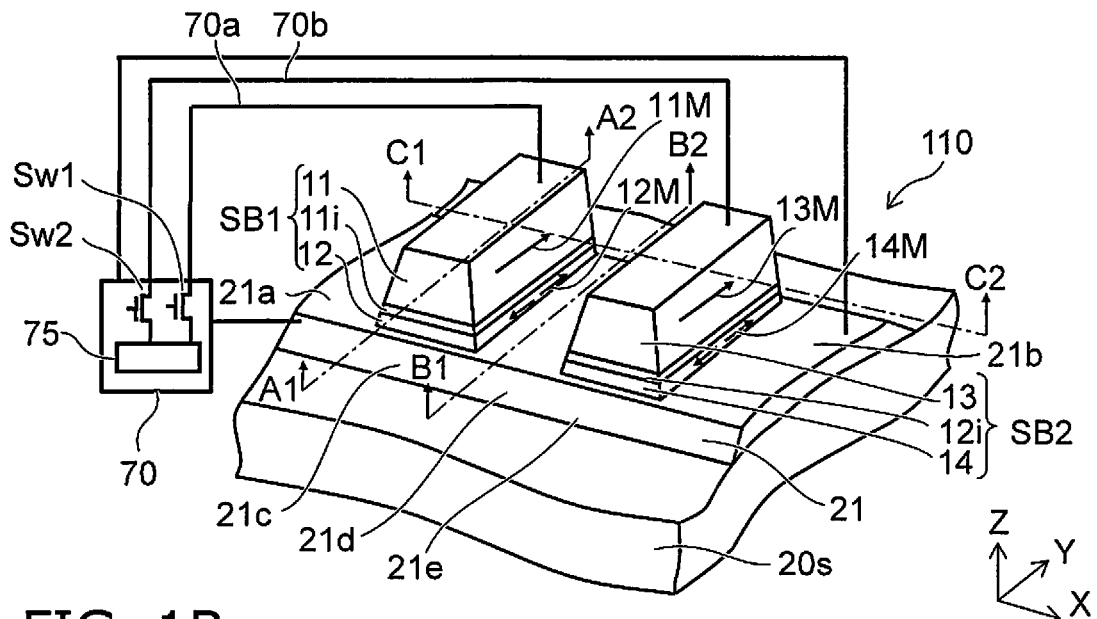
FIG. 1A to FIG. 1D are schematic views illustrating a magnetic memory device according to a first embodiment.

According to one embodiment, a magnetic memory device includes a first member, a first memory cell, and a controller. The first member includes a first region, a second region, and a third region between the first region and the second region. The first memory cell includes a first magnetic layer, a second magnetic layer, and a first nonmagnetic layer. The second magnetic layer is provided between the third region and the first magnetic layer in a first direction crossing a second direction. The second direction is from the first region toward the second region. The first nonmagnetic layer is provided between the first magnetic layer and the second magnetic layer. The controller is electrically connected to the first region, the second region, and the first magnetic layer. The controller is configured to program first information to the first memory cell by setting the first magnetic layer to a first electric potential while supplying a first current to the first member from the first region toward the second region. The controller is configured to program second information to the first memory cell by setting the first magnetic layer to a second electric potential while supplying the first current to the first member. The second electric potential is different from the first electric potential. The second information is different from the first information.

According to another embodiment, a magnetic memory device includes a first member, a first magnetic layer, a second magnetic layer, a first nonmagnetic layer, a first intermediate layer region, and a controller. The first member includes a first region, a second region, and a third region between the first region and the second region. The second magnetic layer is provided between the third region and the first magnetic layer in a first direction crossing a second direction. The second direction is from the first region toward the second region. The first nonmagnetic layer is provided between the first magnetic layer and the second magnetic layer. The first intermediate layer region includes at least one selected from the group consisting of Cu, Ag, Al, Au, and Ir and is provided between the third region and the second magnetic layer in the first direction. The controller is electrically connected to the first region, the second region, and the first intermediate layer region. In a first operation, the controller is configured to supply a first current to the first member from the first region toward the second region and sets the first intermediate layer region to a first electric potential referenced to a electric potential of the first member. In a second operation, the controller is configured to supply a second current to the first member from the first region toward the second region and sets the first intermediate layer region to a second electric potential referenced to the electric potential of the first member. The second electric potential is different from the first electric potential. A first electrical resistance between the first intermediate layer region and the first magnetic layer after the first operation is different from a second electrical resistance between the first intermediate layer region and the first magnetic layer after the second operation.

According to another embodiment, a magnetic memory device includes a first member, a first magnetic layer, a second magnetic layer, a first nonmagnetic layer, a third magnetic layer, a fourth magnetic layer, a second nonmagnetic layer, a first intermediate layer region, a second intermediate layer region, and a controller. The first member includes a first region, a second region, a third region between the first region and the second region, a fourth region between the third region and the second region, and a fifth region between the fourth region and the second region. The second magnetic layer is provided between the third region and the first magnetic layer in a first direction crossing a second direction. The second direction is from the first region toward the second region. The first nonmagnetic layer is provided between the first magnetic layer and the second magnetic layer. The fourth magnetic layer is provided between the fifth region and the third magnetic layer in the first direction. The second nonmagnetic layer is provided between the third magnetic layer and the fourth magnetic layer. The first intermediate layer region includes at least one selected from the group consisting of Cu, Ag, Al, Au, and Ir and is provided between the third region and the second magnetic layer in the first direction. The second intermediate layer region includes at least one selected from the group consisting of Cu, Ag, Al, Au, and Ir and is provided between the fifth region and the fourth magnetic layer in the first direction. The controller is electrically connected to the first region, the second region, the first intermediate layer region, and the second intermediate layer region. In a first operation, the controller is configured to supply a first current to the first member from the first region toward the second region sets the first intermediate layer region to a first electric potential referenced to a electric potential of the first member, and sets the second intermediate layer region to a second electric potential referenced to the electric potential of the first member. The first electric potential is higher than the second electric potential. In a second operation, the controller is configured to supply a second current to the first member from the first region toward the second region, sets the first intermediate layer region to a third electric potential referenced to the electric potential of the first member, and sets the second intermediate layer region to a fourth electric potential referenced to the electric potential of the first member. The fourth electric potential is higher than the third electric potential. A first electrical resistance between the first intermediate layer region and the first magnetic layer after the first operation is different from a second electrical resistance between the second intermediate layer region and the third magnetic layer after the first operation. A third electrical resistance between the first intermediate layer region and the first magnetic layer after the second operation being different from a fourth electrical resistance between the second intermediate layer region and the third magnetic layer after the second operation. The third electrical resistance is different from the first electrical resistance. The fourth electrical resistance is different from the second electrical resistance.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1A to FIG. 1D are schematic views illustrating a magnetic memory device according to a first embodiment.

Figure 1B:
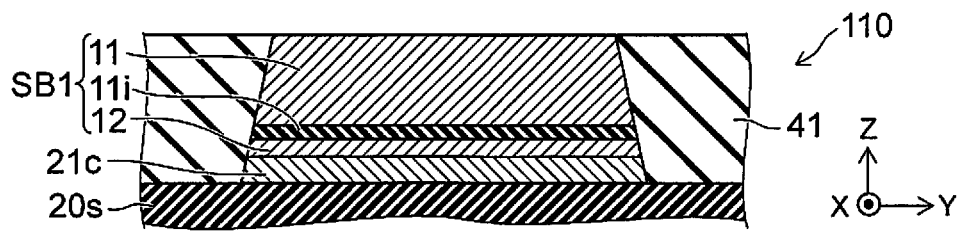
Figure 1C:
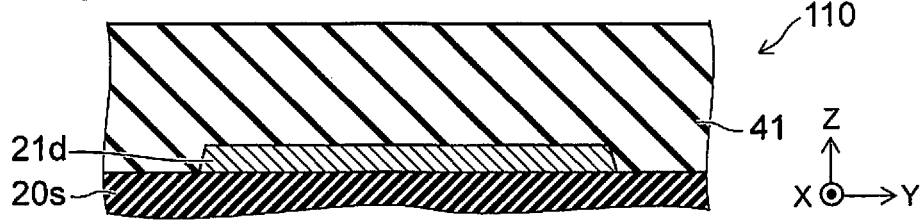

FIG. 1A is a perspective view. FIG. 1B is a line A1-A2 cross-sectional view of FIG. 1A. FIG. 1C is a line B1-B2 cross-sectional view of FIG. 1A. FIG. 1C is a line C1-C2 cross-sectional view of FIG. 1A. In FIG. 1A, the insulating portions (described below) that are included in the magnetic memory device are not illustrated for easier viewing of the drawing.

As shown in FIG. 1A, the magnetic memory device 110 according to the embodiment includes a first member 21, a first magnetic layer 11, a second magnetic layer 12, a first nonmagnetic layer 11$i$, a third magnetic layer 13, a fourth magnetic layer 14, a second nonmagnetic layer 12$i$, and a controller 70.

For example, the first member 21 is provided on a base body 20$s$. The base body 20$s$ may be at least a portion of a substrate. The base body 20$s$ is, for example, insulative. The base body 20$s$ may include, for example, at least one of silicon oxide or aluminum oxide. The silicon oxide may be, for example, thermally-oxidized silicon.

The first member 21 includes first to fifth regions 21$a$ to 21$e$. The third region 21$c$ is provided between the first region 21$a$ and the second region 21$b$. The fourth region 21$d$ is provided between the third region 21$c$ and the second region 21$b$. The fifth region 21$e$ is provided between the fourth region 21$d$ and the second region 21$b$. These regions are continuous with each other.

The first member 21 includes, for example, Bi, Sb, and Te. The first member 21 includes, for example, $(BiSb)_2Te_3$. For example, the first member 21 functions as a "topological insulator." For example, a quasi-two-dimensional electron system is generated at the vicinity of the surface of the first member 21. For example, the conductivity of the surface portion of the first member 21 is higher than the conductivity of the interior of the first member 21. For example, a current flows in the surface portion of the first member 21. Other examples of the material of the first member 21 are described below.

The first magnetic layer 11 is separated from the third region 21$c$ in a first direction. The second magnetic layer 12 is provided between the third region 21$c$ and the first magnetic layer 11 in the first direction. The first nonmagnetic layer 11$i$ is provided between the first magnetic layer 11 and the second magnetic layer 12. Another layer may be provided between the first magnetic layer 11 and the first nonmagnetic layer 11$i$. Another layer may be provided between the second magnetic layer 12 and the first nonmagnetic layer 11$i$.

The first direction is, for example, a Z-axis direction. One direction perpendicular to the Z-axis direction is taken as an X-axis direction. A direction perpendicular to the Z-axis direction and the X-axis direction is taken as a Y-axis direction.

The first direction crosses a second direction that is from the first region 21$a$ toward the second region 21$b$. In the example, the second direction corresponds to the X-axis direction.

The third magnetic layer 13 is separated from the fifth region 21$e$ in the first direction (the Z-axis direction). The direction from the first magnetic layer 11 toward the third magnetic layer 13 is aligned with the X-axis direction. The fourth magnetic layer 14 is provided between the fifth region 21$e$ and the third magnetic layer 13 in the first direction. The second nonmagnetic layer 12$i$ is provided between the third magnetic layer 13 and the fourth magnetic layer 14. Another layer may be provided between the third magnetic layer 13 and the second nonmagnetic layer 12$i$. Another layer may be provided between the fourth magnetic layer 14 and the second nonmagnetic layer 12$i$.

Figure 1D:
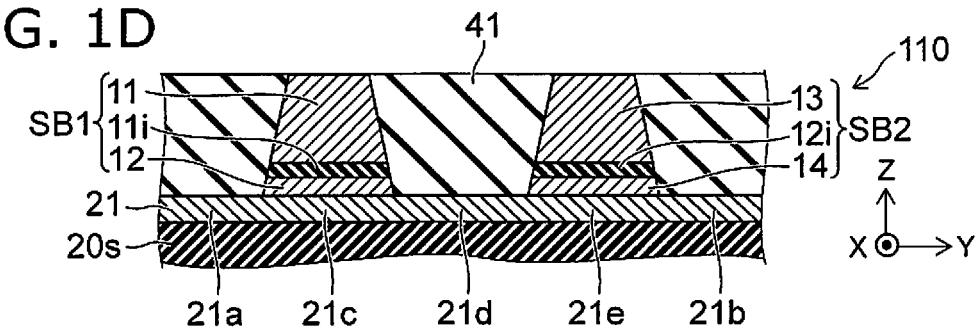

As shown in FIG. 1B to FIG. 1D, an insulating portion 41 is provided around a first stacked body SB1 and a second stacked body SB2. The insulating portion 41 is not illustrated in FIG. 1A.

The first magnetic layer 11 and the third magnetic layer 13 are, for example, ferromagnetic. The second magnetic layer 12 and the fourth magnetic layer 14 are, for example, ferromagnetic or soft magnetic. The first to fourth magnetic layers 11 to 14 include, for example, at least one selected from the group consisting of Fe and Co. The first nonmagnetic layer 11$i$ and the second nonmagnetic layer 12$i$ include, for example, MgO. These nonmagnetic layers may include, for example, Cu. Other examples of the materials of these magnetic layers and nonmagnetic layers are described below.

The first magnetic layer 11, the second magnetic layer 12, and the first nonmagnetic layer 11i are included in the first stacked body SB1. For example, the first stacked body SB1 corresponds to one memory portion (memory cell). The third magnetic layer 13, the fourth magnetic layer 14, and the second nonmagnetic layer 12i are included in the second stacked body SB2. For example, the second stacked body SB2 corresponds to another one memory portion (memory cell). For example, the first stacked body SB1 corresponds to a first memory cell. For example, the second stacked body SB2 corresponds to a second memory cell.

The first magnetic layer 11 and the third magnetic layer 13 are, for example, fixed magnetic layers. The second magnetic layer 12 and the fourth magnetic layer 14 are, for example, free magnetic layers. A first magnetization 11M of the first magnetic layer 11 does not change easily compared to a second magnetization 12M of the second magnetic layer 12. A third magnetization 13M of the third magnetic layer 13 does not change easily compared to a fourth magnetization 14M of the fourth magnetic layer 14. For example, the first magnetic layer 11 and the third magnetic layer 13 function as reference layers. For example, the second magnetic layer 12 and the fourth magnetic layer 14 function as memory layers.

For example, the first stacked body SB1 and the second stacked body SB2 function as magnetic variable resistance elements. For example, a TMR (Tunnel Magnetoresistance) effect occurs in these stacked bodies. For example, the electrical resistance of a path including the first magnetic layer 11, the first nonmagnetic layer 11i, and the second magnetic layer 12 changes according to the difference between the orientation of the first magnetization 11M and the orientation of the second magnetization 12M. The first stacked body SB1 includes, for example, a magnetic tunnel junction (MTJ). For example, the first stacked body SB1 corresponds to a MTJ element. For example, the first stacked body SB1 may correspond to a GMR element.

The controller 70 is electrically connected to the first region 21a and the second region 21b. In the example, the controller 70 is further electrically connected to the first magnetic layer 11 and the third magnetic layer 13.

For example, a drive circuit 75 is provided in the controller 70. The drive circuit 75 is electrically connected to the first magnetic layer 11 by a first interconnect 70a. The drive circuit 75 is electrically connected to the third magnetic layer 13 by a second interconnect 70b. In the example, a first switch Sw1 (e.g., a transistor) is provided in a current path between the drive circuit 75 and the first magnetic layer 11. On the other hand, a second switch Sw2 (e.g., a transistor) is provided in a current path between the drive circuit 75 and the third magnetic layer 13. These switches are included in the controller 70.

For example, the second magnetization 12M of the second magnetic layer 12 changes due to a current flowing in the first member 21 and the orientation of an electric field applied to the surface of the first member 21. For example, the fourth magnetization 14M of the fourth magnetic layer 14 changes due to the current flowing in the first member 21 and the orientation of the electric field applied to the surface of the first member 21. Examples of the changes of these magnetizations are described below.

For example, the electrical resistance between the first magnetic layer 11 and the first region 21a and the electrical resistance between the third magnetic layer 13 and the first region 21a change. For example, the electrical resistance difference is based on the change of the state of the second magnetization 12M and the change of the state of the fourth magnetization 14M.

In a read operation, the controller 70 may detect a characteristic (which may be a voltage, a current, or the like) corresponding to the electrical resistance between the first magnetic layer 11 and the first member 21. In the read operation, the controller 70 may detect a characteristic (which may be a voltage, a current, or the like) corresponding to the electrical resistance between the third magnetic layer 13 and the first member 21.

For example, the second magnetic layer 12 functions as a layer that stores information. For example, a first state in which the second magnetization 12M is oriented in one direction corresponds to first information to be stored. A second state in which the second magnetization 12M is oriented in another direction corresponds to second information to be stored. For example, the first information corresponds to one of "0" or "1." The second information corresponds to the other of "0" or "1."

Examples of the operations of the magnetic memory device 110 will now be described. For example, the following operations are performed by the controller 70.

FIG. 2A to FIG. 2D are schematic views illustrating the magnetic memory device according to the first embodiment.

In the example as shown in FIG. 2A and FIG. 2B, the first interconnect 70a is connected to the first magnetic layer 11 via a first electrode 11E. The second interconnect 70b is connected to the third magnetic layer 13 via a second electrode 13E.

The controller 70 performs at least a first operation OP1 and a second operation OP2.

In the first operation OP1 as shown in FIG. 2A, the controller 70 supplies a first current Iw1 to the first member 21. The first current Iw1 is a current from the first region 21a toward the second region 21b. In the first operation OP1, the controller 70 sets the first magnetic layer 11 to a first electric potential V1 and sets the third magnetic layer 13 to a second electric potential V2. These electric potentials are electric potentials referenced to a electric potential V0 of the first member 21. The electric potential V0 of the first member 21 is, for example, the electric potential of the first region 21a or the electric potential of the second region 21b. The first electric potential V1 is higher than the second electric potential V2.

In the second operation OP2 as shown in FIG. 2B, the controller 70 supplies a second current Iw2 to the first member 21. The second current Iw2 is a current from the first region 21a toward the second region 21b. For example, the magnitude of the second current Iw2 is substantially the same as the magnitude of the first current Iw1. Accordingly, the second current Iw2 may be substantially the same as the first current Iw1. In the second operation OP2, the controller 70 sets the first magnetic layer 11 to a third electric potential V3 and sets the third magnetic layer 13 to a fourth electric potential V4. These electric potentials are electric potentials referenced to the electric potential V0 of the first member 21 (e.g., the electric potential of the first region 21a or the electric potential of the second region 21b). The fourth electric potential V4 is higher than the third electric potential V3. For example, the third electric potential V3 may be substantially the same as the second electric potential V2. For example, the fourth electric potential V4 may be substantially the same as the first electric potential V1.

The electrical resistance between the first member 21 and the first magnetic layer 11 after the first operation OP1 is taken as a first electrical resistance. The electrical resistance between the first member 21 and the third magnetic layer 13 after the first operation OP1 is taken as a second electrical resistance. The first electrical resistance is different from the second electrical resistance. For example, the first electrical resistance is lower than the second electrical resistance.

The electrical resistance between the first member 21 and the first magnetic layer 11 after the second operation OP2 is taken as a third electrical resistance. The electrical resistance between the first member 21 and the third magnetic layer 13 after the second operation OP2 is taken as a fourth electrical resistance. The third electrical resistance is different from the fourth electrical resistance. For example, the third electrical resistance is higher than the fourth electrical resistance. The third electrical resistance is different from the first electrical resistance. The fourth electrical resistance is different from the second electrical resistance.

For example, the third electrical resistance is higher than the first electrical resistance. The fourth electrical resistance is lower than the second electrical resistance.

In the description recited above, a low resistance state and a high resistance state are interchanged according to the first magnetization 11M and the third magnetization 13M. Accordingly, in the embodiment, for example, the absolute value of the difference between the first electrical resistance and the second electrical resistance is greater than a first absolute value of the difference between the first electrical resistance and the fourth electrical resistance and greater than a second absolute value of the difference between the second electrical resistance and the third electrical resistance. For example, the absolute value of the difference between the second electrical resistance and the fourth electrical resistance is greater than the first absolute value recited above and greater than the second absolute value recited above.

For example, after the first operation OP1, the first stacked body SB1 is in a first state STL (e.g., the low resistance state). After the first operation OP1, the second stacked body SB2 is in a second state STH (e.g., the high resistance state). For example, after the second operation OP2, the first stacked body SB1 is in the second state STH. After the second operation OP2, the second stacked body SB2 is in the first state STL.

For example, the first state STL is taken to be a "0" state. For example, the second state STH is taken to be a "1" state. For example, in the first operation OP1, the information of "01" is programmed to the set of the first stacked body SB1 and the second stacked body SB2. For example, in the second operation OP2, the information of "10" is programmed to the set of the first stacked body SB1 and the second stacked body SB2.

Such an electrical resistance difference is based on the difference between the states of the second magnetization 12M of the second magnetic layer 12 and the fourth magnetization 14M of the fourth magnetic layer 14. In the first operation OP1 in the example of FIG. 2A, the second magnetization 12M is "parallel" to the first magnetization 11M. In the first operation OP1, the fourth magnetization 14M is "antiparallel" to the third magnetization 13M. In the second operation OP2 in the example of FIG. 2B, the second magnetization 12M is "antiparallel" to the first magnetization 11M. In the second operation OP2, the fourth magnetization 14M is "parallel" to the third magnetization 13M.

Thus, in the embodiment, the orientation of the second magnetization 12M and the orientation of the fourth magnetization 14M are controlled by the electric potential of the first magnetic layer 11 and the electric potential of the third magnetic layer 13.

This phenomenon is based on a characteristic of the first member 21. For example, the state of the polarization in the surface of the first member 21 changes due to the electric potential of the first magnetic layer 11 and the electric potential of the third magnetic layer 13. For example, the orientation of the spin-orbit torque (SOT) applied to the second magnetic layer 12 (and the fourth magnetic layer 14) from the first member 21 changes according to the change of the state of the polarization. Thereby, the orientation of the second magnetization 12M and the orientation of the fourth magnetization 14M can be controlled by the electric potential of the first magnetic layer 11 and the electric potential of the third magnetic layer 13. In the example, the orientation of the electric field at the surface of the first member 21 is controlled by the electric potential of the first magnetic layer 11 and the electric potential of the third magnetic layer 13.

On the other hand, there is a magnetic memory device of a reference example in which a metal layer of Ta or the like is used. In the reference example, the orientation of the SOT is dependent on the orientation of the current flowing in the metal layer of Ta, etc. The orientation of the magnetization of the magnetic layer changes due to the orientation of the current. In such a case, for example, the ease of the changes of the magnetizations of the second magnetic layer 12 and the fourth magnetic layer 14 is controlled by the voltages applied to the first magnetic layer 11 and the third magnetic layer 13. Thereby, for example, the control of the selection or the unselection of the memory cells is performed. In the reference example, the orientation of the current flowing in the metal layer is modified to change the orientation of the second magnetization 12M and the orientation of the fourth magnetization 14M. In the reference example, the margin of the control of the selection or the unselection due to the voltage applied to the first magnetic layer 11 and the third magnetic layer 13 is not always wide. For example, there are cases where the operations become unstable.

Conversely, in the magnetic memory device 110 according to the embodiment, the orientation of the second magnetization 12M and the orientation of the fourth magnetization 14M are changed not by the orientation of the current flowing in the first member 21 but by the orientation of the electric field applied to the first member 21.

In the embodiment, for example, the second magnetization 12M is taken to be in a "+magnetization direction" when the current flowing in the first member 21 is in a "+current direction" and the orientation of the electric field applied to the first member 21 is a "+electric field direction." In such a case, for example, the second magnetization 12M is a "−magnetization direction" when the current flowing in the first member 21 is in the "+current direction" and the orientation of the electric field applied to the first member 21 is the "−electric field direction."

For example, the second magnetization 12M is in the "−magnetization direction" when the current flowing in the first member 21 is in the "−current direction" and the orientation of the electric field applied to the first member 21 is the "+electric field direction." In such a case, for example, the second magnetization 12M is in the "+magnetization direction" when the current flowing in the first member 21 is in the "−current direction" and the orientation of the electric field applied to the first member 21 is the "−electric field direction."

In the embodiment, the program operation can be performed without changing the orientation of the current flowing in the first member 21. The controllability of the selection or the unselection is high. For example, stable operations are obtained. According to the embodiment, a magnetic memory device can be provided in which stable operations are obtained.

In the reference example recited above, a current is caused to flow in the metal layer in one orientation; and one piece of information of "0" or "1" is programmed to all of the multiple stacked bodies (the memory cells). Subsequently, a current is caused to flow in the metal layer in the reverse orientation; and the program operation of the other information of "0" or "1" is performed to the desired stacked body. For example, one program operation includes a two-stage operation (two current supplies).

Conversely, in the embodiment, the orientation of the current for programming of the information is not modified. Therefore, one program operation includes a one-stage operation (one current supply). For example, a high-speed program operation is obtained. A two-stage program operation may be performed in the embodiment. In such a case, more stable control is possible compared to the case of the reference example recited above.

In the embodiment, the orientation of the current flowing in the first member 21 may not be modified. Thereby, the configuration of the circuit (e.g., the controller 70) is simple.

Thus, in the embodiment, the controller 70 programs the first information to the first memory cell (the first stacked body SB1) by setting the first magnetic layer 11 to the first electric potential V1 while supplying the first current to the first member 21 from the first region 21a toward the second region 21b. The controller 70 programs, to the first memory cell, the second information that is different from the first information by setting the first magnetic layer 11 to the second electric potential (in the example of FIG. 2B, the third electric potential V3) that is different from the first electric potential V1 while supplying the first current recited above to the first member 21.

The controller 70 programs the first information to the second memory cell (the second stacked body SB2) (referring to FIG. 2B) by setting the third magnetic layer 13 to the third electric potential (in the example of FIG. 2B, the fourth electric potential V4) while supplying the first current recited above (the current from the first region 21a toward the second region 21b) to the first member 21. The controller 70 programs the second information to the second memory cell (the second stacked body SB2) by setting the third magnetic layer 13 to the fourth electric potential (in the example of FIG. 2A, the second electric potential V2) that is different from the third electric potential while supplying the first current recited above to the first member 21.

In the embodiment, in the first operation OP1 as shown in FIG. 2A, the first current Iw1 flows through the fourth region 21d in the orientation from the first region 21a toward the second region 21b. In the second operation OP2 as shown in FIG. 2B, the second current Iw2 flows through the fourth region 21d in the orientation from the first region 21a toward the second region 21b.

For example, in the first operation OP1, the first current Iw1 flows through the third region 21c in the orientation from the first region 21a toward the second region 21b. In the first operation OP1, the first current Iw1 flows through the fifth region 21e in the orientation from the first region 21a toward the second region 21b. In the second operation OP2, the second current Iw2 flows through the third region 21c in the orientation from the first region 21a toward the second region 21b. In the second operation OP2, the second current Iw2 flows through the fifth region 21e in the orientation from the first region 21a toward the second region 21b.

As shown in FIG. 2C and FIG. 2D, the controller 70 may further perform a third operation OP3 and a fourth operation OP4. For example, in the third operation OP3, the information of "00" is programmed to the set of the first stacked body SB1 and the second stacked body SB2. For example, in the fourth operation OP4, the information of "11" is programmed to the set of the first stacked body SB1 and the second stacked body SB2.

In the third operation OP3 as shown in FIG. 2C, the controller 70 supplies a third current Iw3 to the first member 21 from the first region 21a toward the second region 21b. Further, in the third operation OP3, the controller 70 sets the first magnetic layer 11 to the first electric potential V1 and sets the third magnetic layer 13 to the fourth electric potential V4.

In the fourth operation OP4 as shown in FIG. 2D, the controller 70 supplies a fourth current Iw4 to the first member 21 from the first region 21a toward the second region 21b. Further, in the fourth operation OP4, the controller 70 sets the first magnetic layer 11 to the third electric potential V3 and sets the third magnetic layer 13 to the second electric potential V2. The third current Iw3 may be the same as the fourth current Iw4.

A fifth electrical resistance between the first member 21 and the first magnetic layer 11 after the third operation OP3 is lower than the second electrical resistance. A sixth electrical resistance between the first member 21 and the third magnetic layer 13 after the third operation OP3 is lower than the second electrical resistance. For example, after the third operation OP3, the first stacked body SB1 is in the first state STL (e.g., the low resistance state). After the third operation OP3, the second stacked body SB2 is in the first state STL.

On the other hand, a seventh electrical resistance between the first member 21 and the first magnetic layer 11 after the fourth operation OP4 is higher than the first electrical resistance. An eighth electrical resistance between the first member 21 and the third magnetic layer 13 after the fourth operation OP4 is higher than the first electrical resistance. For example, after the fourth operation OP4, the first stacked body SB1 is in the second state STH (e.g., the high resistance state). After the fourth operation OP4, the second stacked body SB2 is in the second state STH As described above, the low resistance state and the high resistance state may be interchanged. Accordingly, in the embodiment, the absolute value of the difference between the third electrical resistance and the fifth electrical resistance between the first member 21 and the first magnetic layer 11 after the third operation OP3 is larger than the first absolute value (the absolute value of the difference between the first electrical resistance and the fourth electrical resistance) and larger than the second absolute value (the absolute value of the difference between the second electrical resistance and the third electrical resistance).

The absolute value of the difference between the second electrical resistance and the sixth electrical resistance between the first member 21 and the third magnetic layer 13 after the third operation OP3 is greater than the first absolute value and greater than the second absolute value.

The absolute value of the difference between the first electrical resistance and the seventh electrical resistance between the first member 21 and the first magnetic layer 11 after the fourth operation OP4 is greater than the first absolute value and greater than the second absolute value.

The absolute value of the difference between the fourth electrical resistance and the eighth electrical resistance between the first member 21 and the third magnetic layer 13 after the fourth operation OP4 is greater than the first absolute value and greater than the second absolute value.

Thus, in the embodiment, the information of the memory cells can be controlled by the electric potential of the first magnetic layer 11 and the electric potential of the third magnetic layer 13.

In the description recited above, the electrical resistance may be the electrical resistance between the first region 21a and the magnetic layer. The electrical resistance may be the electrical resistance between the second region 21b and the magnetic layer. The electrical resistance may be the electrical resistance between the magnetic layer and any position of the first member 21.

Figure 3:
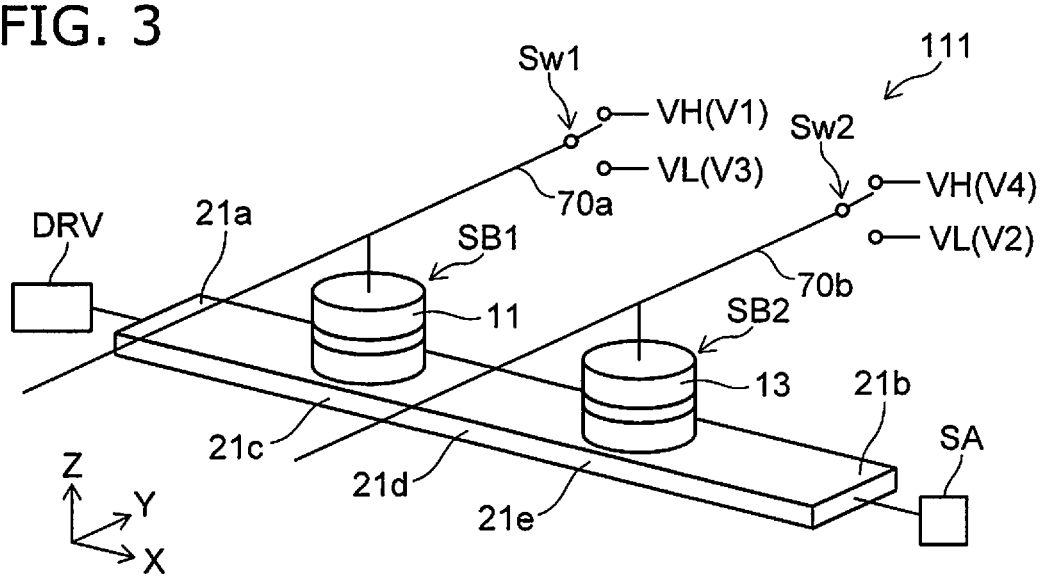
FIG. 3 is a schematic view illustrating a magnetic memory device according to the first embodiment.

FIG. 3 is a schematic view illustrating a magnetic memory device according to the first embodiment.

As shown in FIG. 3, the first member 21, the first stacked body SB1, and the second stacked body SB2 are provided in the magnetic memory device 111 as well. The first interconnect 70a is connected to the first magnetic layer 11. The first interconnect 70a is set to a high electric potential VH or a low electric potential VL by the first switch Sw1. The high electric potential VH is, for example, the first electric potential V1. The low electric potential VL is, for example, the third electric potential V3.

The second interconnect 70b is connected to the third magnetic layer 13. The second interconnect 70b is set to the high electric potential VH or the low electric potential VL by the second switch Sw2. The high electric potential VH is, for example, the fourth electric potential V4. The low electric potential VL is, for example, the second electric potential V2. For example, the high electric potential VH or the low electric potential VL is supplied by the drive circuit 75 (referring to FIG. 1A).

In the example, a current supplier DRV is connected to the first region 21a of the first member 21. In the example, a sense amplifier SA is connected to the second region 21b of the first member 21. In the embodiment, the current supplier DRV may be connected to the second region 21b; and the sense amplifier SA may be connected to the first region 21a. In the embodiment, the first region 21a and the second region 21b are mutually-interchangeable.

Figure 4:
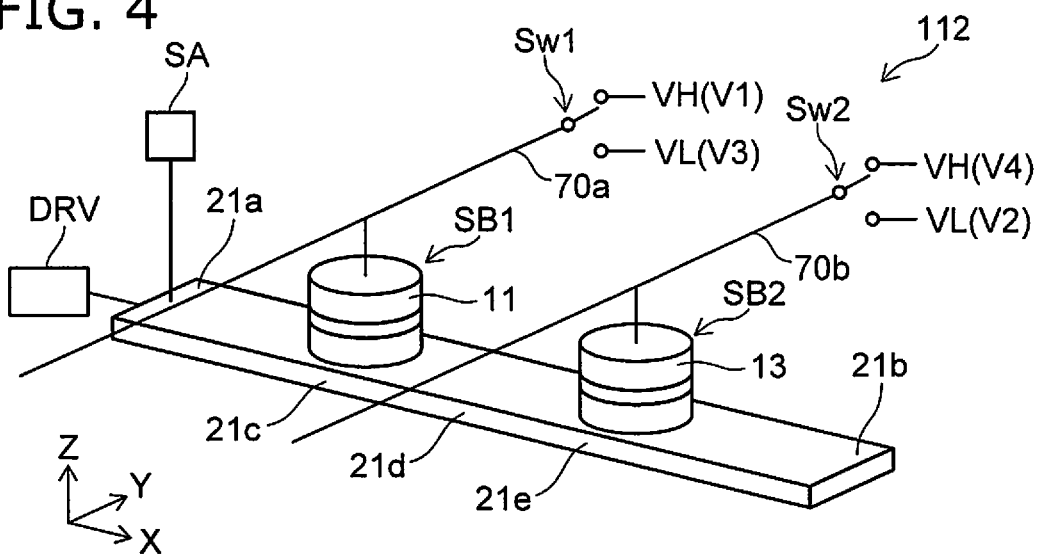
FIG. 4 is a schematic view illustrating a magnetic memory device according to the first embodiment.

FIG. 4 is a schematic view illustrating a magnetic memory device according to the first embodiment.

As shown in FIG. 4, the first member 21, the first stacked body SB1, and the second stacked body SB2 are provided in the magnetic memory device 112 as well. In the magnetic memory device 112, the current supplier DRV is connected to the first region 21a. The sense amplifier SA is connected to the first region 21a of the first member 21.

Figure 5:
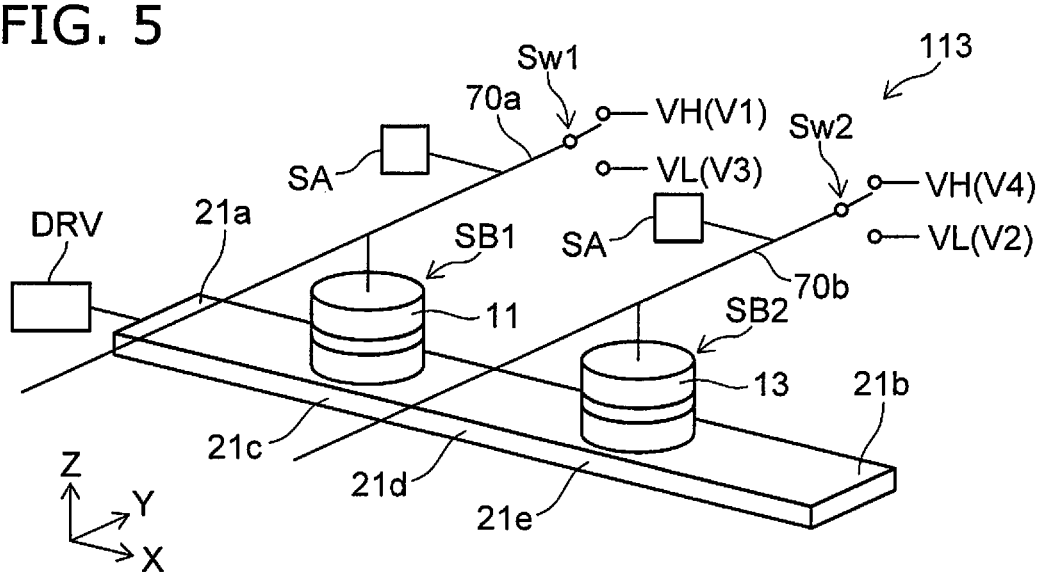
FIG. 5 is a schematic view illustrating a magnetic memory device according to the first embodiment.

FIG. 5 is a schematic view illustrating a magnetic memory device according to the first embodiment.

As shown in FIG. 5, the first member 21, the first stacked body SB1, and the second stacked body SB2 are provided in the magnetic memory device 113 as well. In the magnetic memory device 113, the sense amplifier SA is connected to the first interconnect 70a. Another sense amplifier SA is connected to the second interconnect 70b.

For example, the current supplier DRV and the sense amplifier SA recited above may be included in the controller 70 (referring to FIG. 1A).

Figure 6A:
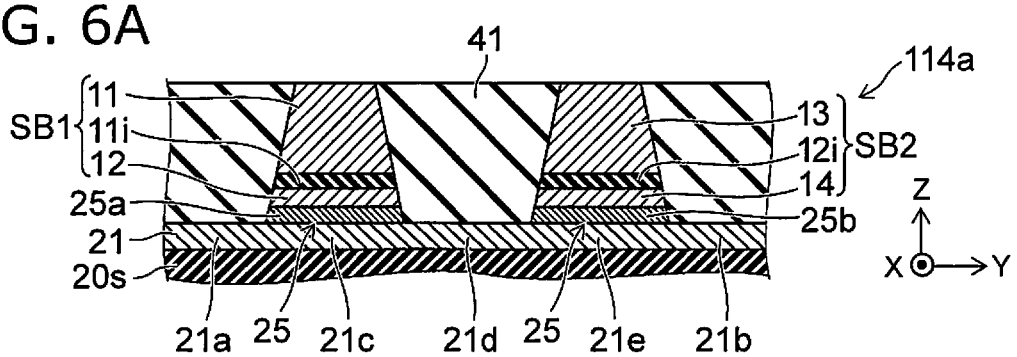
FIG. 6A and FIG. 6B are schematic cross-sectional views illustrating magnetic memory devices according to the first embodiment.
Figure 6B:
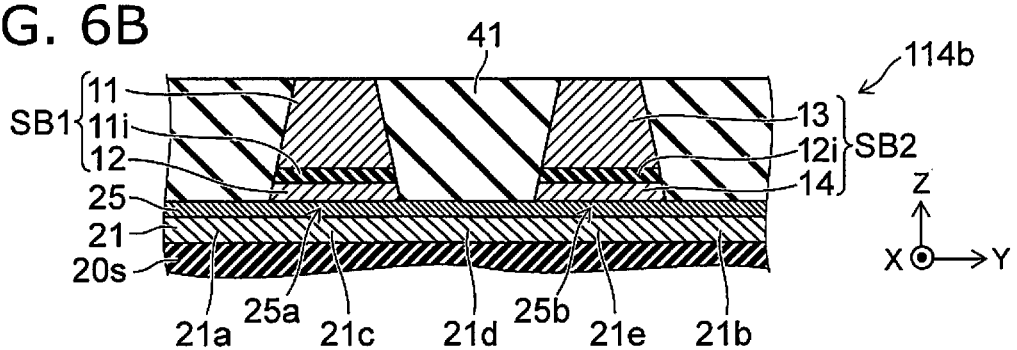

FIG. 6A and FIG. 6B are schematic cross-sectional views illustrating magnetic memory devices according to the first embodiment.

These drawings are cross-sectional views corresponding to line C1-C2 of FIG. 1A.

As shown in FIG. 6A and FIG. 6B, a first intermediate layer 25 is provided in the magnetic memory devices 114a and 114b. The first intermediate layer 25 includes at least one selected from the group consisting of Cu, Ag, Al, Au, and Ir. The first intermediate layer 25 is, for example, a Cu layer. The first intermediate layer 25 may be, for example, a Ag layer. The first intermediate layer 25 includes, for example, a first intermediate layer region 25a and a second intermediate layer region 25b.

In the magnetic memory device 114a as shown in FIG. 6A, the first intermediate layer region 25a of the first intermediate layer 25 is provided between the third region 21c and the second magnetic layer 12. The second intermediate layer region 25b of the first intermediate layer 25 is provided between the fifth region 21e and the fourth magnetic layer 14. In the magnetic memory device 114a, the first intermediate layer region 25a is separated from the second intermediate layer region 25b.

In the magnetic memory device 114b as shown in FIG. 6B, the first intermediate layer region 25a is continuous with the second intermediate layer region 25b.

In the case where such a first intermediate layer 25 is provided, spin-orbit torque occurs between the first member 21 and the first intermediate layer 25. Spin diffusion of the spin-orbit torque occurs through the first intermediate layer 25. For example, the effect on the magnetization of the second magnetic layer 12 strengthens. More stable operations are obtained.

The thickness along the first direction (the Z-axis direction) of the first intermediate layer 25 is, for example, not less than 0.5 nm and not more than 20 nm. For such a thickness, the spin-orbit torque is supplied to the second magnetic layer 12 in a good state. For example, in the case where the thickness of the first intermediate layer 25 is thinner than 0.5 nm, it is difficult to obtain a uniform first intermediate layer 25; and it is difficult to obtain stable characteristics. In the case where the thickness of the first intermediate layer 25 is thicker than 20 nm, the current component of the current divided into the first intermediate layer 25 becomes excessively large. For example, the efficiency when referenced to the entire supplied current decreases.

Figure 7A:
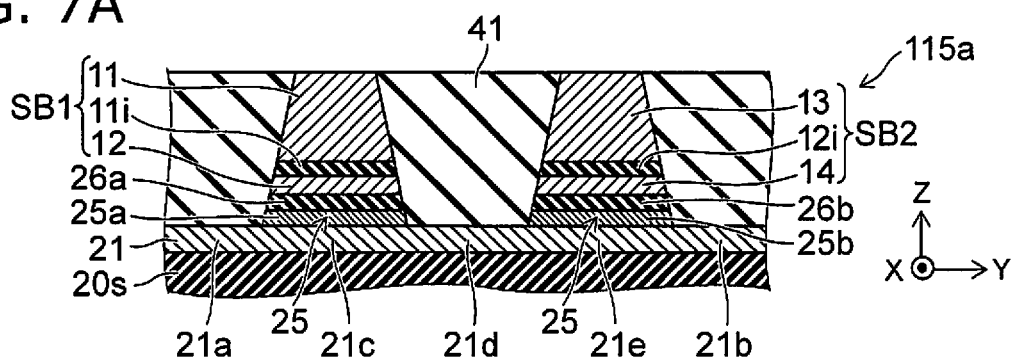
FIG. 7A to FIG. 7C are schematic cross-sectional views illustrating magnetic memory devices according to the first embodiment.
Figure 7B:
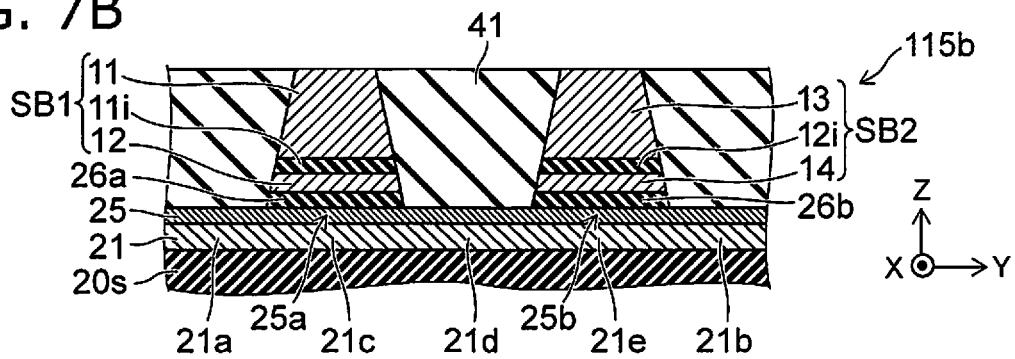
Figure 7C:
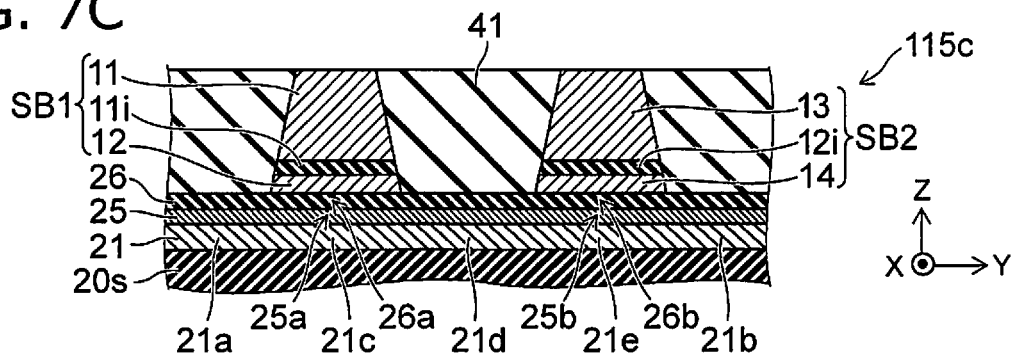

FIG. 7A to FIG. 7C are schematic cross-sectional views illustrating magnetic memory devices according to the first embodiment.

These drawings are cross-sectional views corresponding to line C1-C2 of FIG. 1A.

As shown in FIG. 7A to FIG. 7C, a second intermediate layer 26 is provided in the magnetic memory devices 115a to 115c. The first intermediate layer 25 described above is provided in these examples. The second intermediate layer 26 includes at least one selected from the group consisting of Mg, Al, and Ti and at least one selected from the group consisting of oxygen and nitrogen. For example, the second intermediate layer 26 includes MgO. The second intermediate layer 26 includes a third intermediate layer region 26a and a fourth intermediate layer region 26b.

In the magnetic memory devices 115a to 115c, the third intermediate layer region 26a of the second intermediate layer 26 is provided between the first intermediate layer region 25a and the second magnetic layer 12. The fourth intermediate layer region 26b of the second intermediate layer 26 is provided between the second intermediate layer region 25b and the fourth magnetic layer 14.

In the magnetic memory devices 115a and 115b, the third intermediate layer region 26a is separated from the fourth intermediate layer region 26b. In the magnetic memory device 115c, the third intermediate layer region 26a is continuous with the fourth intermediate layer region 26b. In the magnetic memory devices 115b and 115c, the first intermediate layer region 25a is continuous with the second intermediate layer region 25b.

By providing the second intermediate layer 26, for example, an effective electric field is applied easily to the surface of the first member 21 (the interface with another member). Thereby, the controllability of the magnetization of the second magnetic layer 12 improves further. More stable operations can be performed.

FIG. 8A to FIG. 8C are schematic cross-sectional views illustrating magnetic memory devices according to the first embodiment.

These drawings are cross-sectional views corresponding to line C1-C2 of FIG. 1A.

As shown in FIG. 8A to FIG. 8C, the second intermediate layer 26 is provided in the magnetic memory devices 116a to 116c as well. The first intermediate layer 25 described above is provided in these examples.

In the magnetic memory devices 116a to 116c, the third intermediate layer region 26a is provided between the first intermediate layer region 25a and the third region 21c. The fourth intermediate layer region 26b is provided between the second intermediate layer region 25b and the fifth region 21e. In the magnetic memory devices 116a and 116b, the first intermediate layer region 25a is separated from the second intermediate layer region 25b. In the magnetic memory device 116a, the third intermediate layer region 26a is separated from the fourth intermediate layer region 26b. In the magnetic memory devices 116b and 116c, the third intermediate layer region 26a is continuous with the fourth intermediate layer region 26b. In the magnetic memory device 116c, the first intermediate layer region 25a is continuous with the second intermediate layer region 25b.

In the magnetic memory devices 116a to 116c as well, for example, an effective electric field is applied easily to the surface of the first member 21 (the interface with another member) by providing the second intermediate layer 26. More stable operations can be performed.

The thickness along the first direction (the Z-axis direction) of the second intermediate layer 26 is not less than 0.5 nm and not more than 20 nm. For such a thickness, for example, the spin-orbit torque is transferred to the second magnetic layer 12 in a good state.

Second Embodiment

FIG. 9A to FIG. 9D are schematic views illustrating a magnetic memory device according to a second embodiment.

Figure 10:
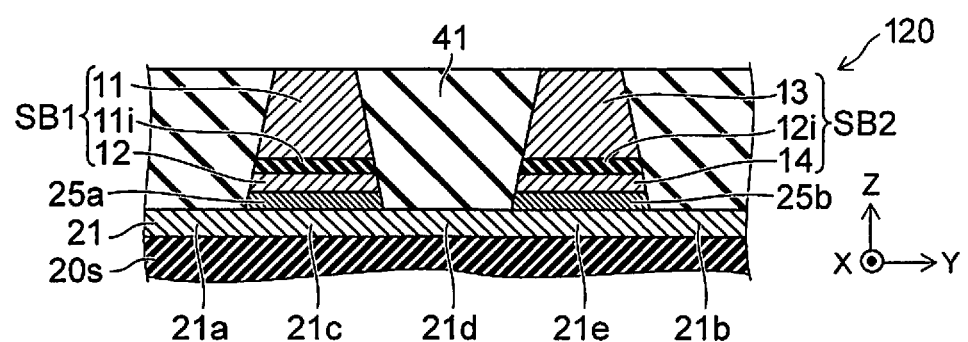
FIG. 10 is a schematic cross-sectional view illustrating the magnetic memory device according to the second embodiment.

FIG. 10 is a schematic cross-sectional view illustrating the magnetic memory device according to the second embodiment.

Figure 9A:
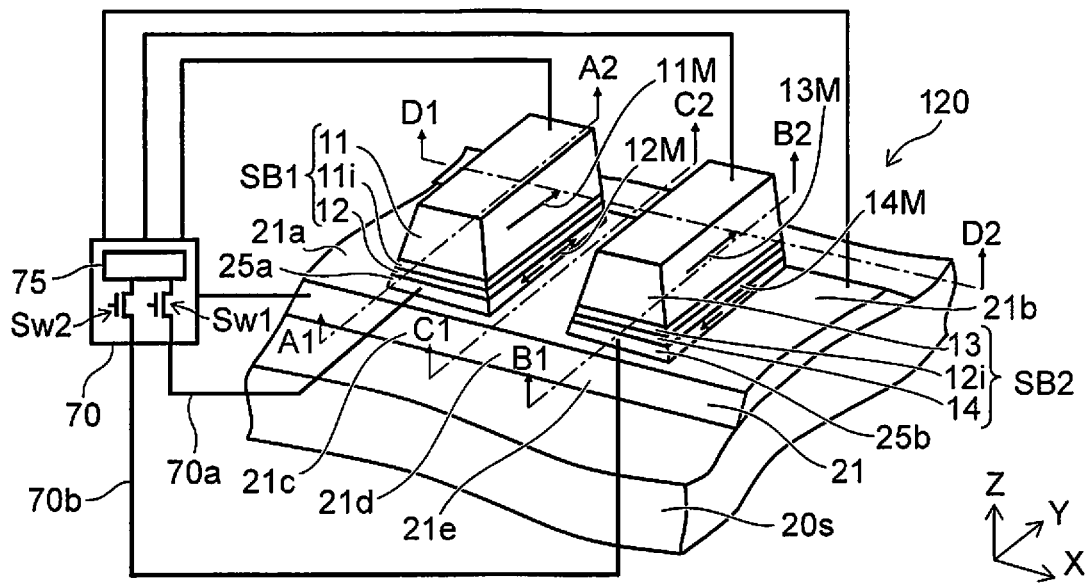
FIG. 9A to FIG. 9D are schematic views illustrating a magnetic memory device according to a second embodiment.
Figure 9B:
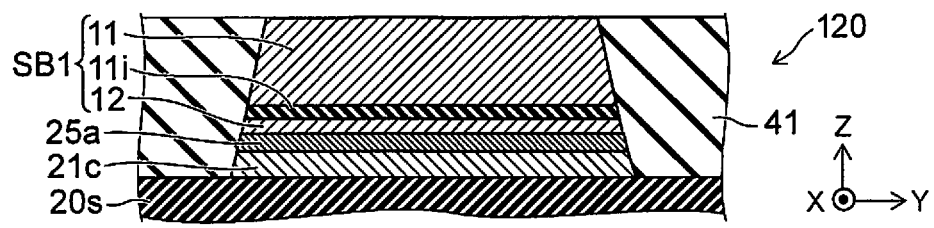
Figure 9C:
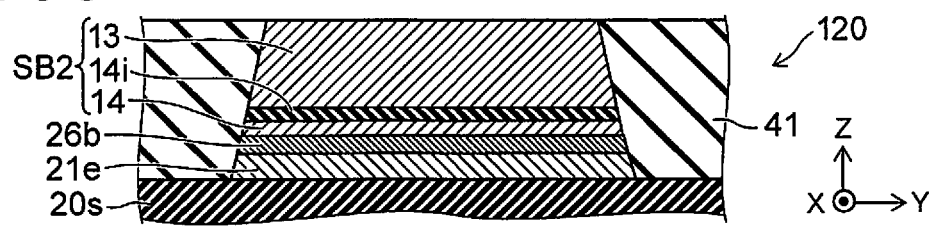
Figure 9D:
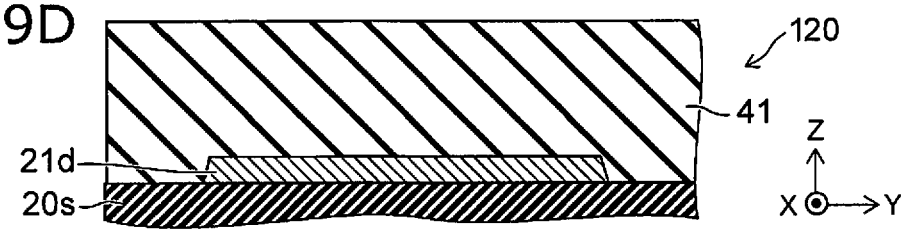

FIG. 9A is a perspective view. FIG. 9B is a line A1-A2 cross-sectional view of FIG. 9A. FIG. 9C is a line B1-B2 cross-sectional view of FIG. 9A. FIG. 9D is a line C1-C2 cross-sectional view of FIG. 9A. FIG. 10 is a line D1-D2 cross-sectional view of FIG. 9A. In FIG. 9A, the insulating portion 41 that is included in the magnetic memory device is not illustrated for easier viewing of the drawing.

A description is omitted as appropriate for configurations similar to the configuration described above.

As shown in FIG. 9A to FIG. 9D and FIG. 10, the magnetic memory device 120 according to the embodiment includes the first member 21, the first magnetic layer 11, the second magnetic layer 12, the first nonmagnetic layer 11i, the first intermediate layer region 25a, and the controller 70. The third magnetic layer 13, the fourth magnetic layer 14, the second nonmagnetic layer 12i, and the second intermediate layer region 25b are further provided in the example.

The first member 21 includes the first to third regions 21a to 21c. In the example, the first member 21 further includes the fourth region 21d and the fifth region 21e. Even in such a case, the third region 21c is provided between the first region 21a and the second region 21b. The fourth region 21d is provided between the third region 21c and the second region 21b. The fifth region 21e is provided between the fourth region 21d and the second region 21b.

In the example as well, the second magnetic layer 12 is provided between the third region 21c and the first magnetic layer 11 in the first direction (a direction crossing the second direction from the first region 21a toward the second region 21b). The first nonmagnetic layer 11i is provided between the first magnetic layer 11 and the second magnetic layer 12.

In the example as well, the fourth magnetic layer 14 is provided between the fifth region 21e and the third magnetic layer 13 in the first direction (the Z-axis direction). The second nonmagnetic layer 12i is provided between the third magnetic layer 13 and the fourth magnetic layer 14.

The first intermediate layer region 25a is provided between the third region 21c and the second magnetic layer 12 in the first direction (the Z-axis direction). The first intermediate layer region 25a includes at least one selected from the group consisting of Cu, Ag, Al, Au, and Ir. The second intermediate layer region 25b is provided between the fifth region 21e and the fourth magnetic layer 14 in the first direction. The second intermediate layer region 25b includes at least one selected from the group consisting of Cu, Ag, Al, Au, and Ir.

The controller 70 is electrically connected to the first region 21a, the second region 21b, and the first intermediate layer region 25a. In the example, the controller 70 is further electrically connected to the second intermediate layer region 25b.

For example, the drive circuit 75 of the controller 70 and the first intermediate layer region 25a are electrically connected by the first interconnect 70a. The drive circuit 75 of the controller 70 and the second intermediate layer region 25b are electrically connected by the second interconnect 70b. In the example, the first switch Sw1 is provided in the current path of the first interconnect 70a. The second switch Sw2 is provided in the current path of the second interconnect 70b.

Examples of the operations performed by the magnetic memory device 120 will now be described.

FIG. 11A to FIG. 11D are schematic views illustrating the magnetic memory device according to the first embodiment.

Figure 11A:
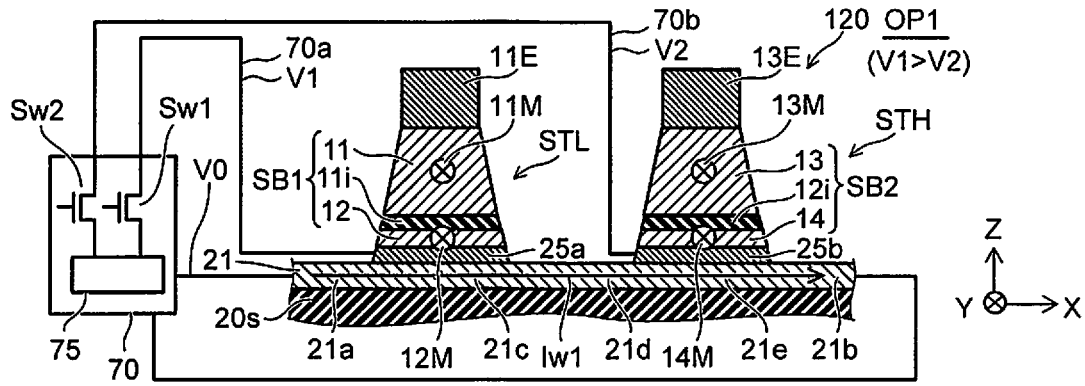
FIG. 11A to FIG. 11D are schematic views illustrating the magnetic memory device according to the first embodiment.
Figure 11B:
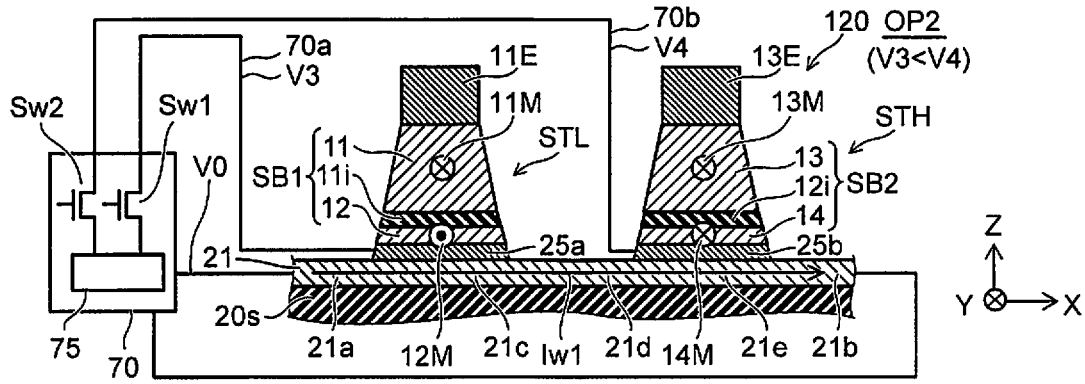

As shown in FIG. 11A and FIG. 11B, the controller 70 performs at least the first operation OP1 and the second operation OP2.

In the first operation OP1 as shown in FIG. 11A, the controller 70 supplies the first current Iw1 to the first member 21 from the first region 21a toward the second region 21b. In the first operation OP1, the controller 70 sets the first intermediate layer region 25a to the first electric potential V1 and sets the second intermediate layer region 25b to the second electric potential V2. The first electric potential V1 and the second electric potential V2 are electric potentials referenced to the electric potential V0 of the first member 21. The first electric potential V1 is higher than the second electric potential V2.

In the second operation OP2 as shown in FIG. 11B, the controller 70 supplies the second current Iw2 to the first member 21 from the first region 21a toward the second region 21b. The second current Iw2 may be the same as the first current Iw1. In the second operation OP2, the controller 70 sets the first intermediate layer region 25a to the third electric potential V3 and sets the second intermediate layer region 25b to the fourth electric potential V4. The third electric potential V3 and the fourth electric potential V4 are electric potentials referenced to the electric potential V0 of the first member 21. The fourth electric potential V4 is higher than the third electric potential V3.

The first electrical resistance between the first intermediate layer region 25a and the first magnetic layer 11 after the first operation OP1 is different from the second electrical resistance between the second intermediate layer region 25b and the third magnetic layer 13 after the first operation OP1. For example, the first electrical resistance is lower than the second electrical resistance.

The third electrical resistance between the first intermediate layer region 25a and the first magnetic layer 11 after the second operation OP2 is different from the fourth electrical resistance between the second intermediate layer region 25b and the third magnetic layer 13 after the second operation OP2. The third electrical resistance is different from the first electrical resistance. The fourth electrical resistance is different from the second electrical resistance. For example, the third electrical resistance is higher than the fourth electrical resistance.

For example, after the first operation OP1, the first stacked body SB1 is in the first state STL (e.g., the low resistance state). After the first operation OP1, the second stacked body SB2 is in the second state STH (e.g., the high resistance state). For example, after the second operation OP2, the first stacked body SB1 is in the second state STH. After the second operation OP2, the second stacked body SB2 is in the first state STL.

For example, in the first operation OP1, the information of "01" is programmed to the set of the first stacked body SB1 and the second stacked body SB2. For example, in the second operation OP2, the information of "10" is programmed to the set of the first stacked body SB1 and the second stacked body SB2.

In the embodiment as well, the low resistance state and the high resistance state may be interchanged. For example, the absolute value of the difference between the first electrical resistance and the second electrical resistance is greater than the first absolute value of the difference between the first electrical resistance and the fourth electrical resistance and greater than the second absolute value of the difference between the second electrical resistance and the third electrical resistance. For example, the absolute value of the difference between the second electrical resistance and the fourth electrical resistance is greater than the first absolute value recited above and greater than the second absolute value recited above.

In the embodiment, for example, the orientation of the electric field at the surface of the first member 21 is controlled by the electric potential of the first intermediate layer region 25a and the electric potential of the second intermediate layer region 25b. Thereby, for example, the orientations of the second magnetization 12M and the fourth magnetization 14M can be controlled.

In the embodiment, the program operation is performed by the current flowing in the first member 21, the electric potential of the first intermediate layer region 25a, and the electric potential of the second intermediate layer region 25b. According to the embodiment, a magnetic memory device can be provided in which stable operations are obtained.

In the read operation of the magnetic memory device 120, the first electrode 11E that is electrically connected to the first magnetic layer 11 (referring to FIG. 11A) is used. In the read operation, the second electrode 13E that is electrically connected to the third magnetic layer 13 (referring to FIG. 11A) is used.

In the first operation OP1 recited above, the first current Iw1 flows through the fourth region 21d in the orientation from the first region 21a toward the second region 21b. In the second operation OP2, the second current Iw2 flows through the fourth region 21d in the orientation from the first region 21a toward the second region 21b.

For example, in the first operation OP1, the first current Iw1 flows through the third region 21c in the orientation from the first region 21a toward the second region 21b. In the first operation OP1, the first current Iw1 flows through the fifth region 21e in the orientation from the first region 21a toward the second region 21b. In the second operation OP2, the second current Iw2 flows through the third region 21c in the orientation from the first region 21a toward the second region 21b. In the second operation OP2, the second current Iw2 flows through the fifth region 21e in the orientation from the first region 21a toward the second region 21b.

Figure 11C:
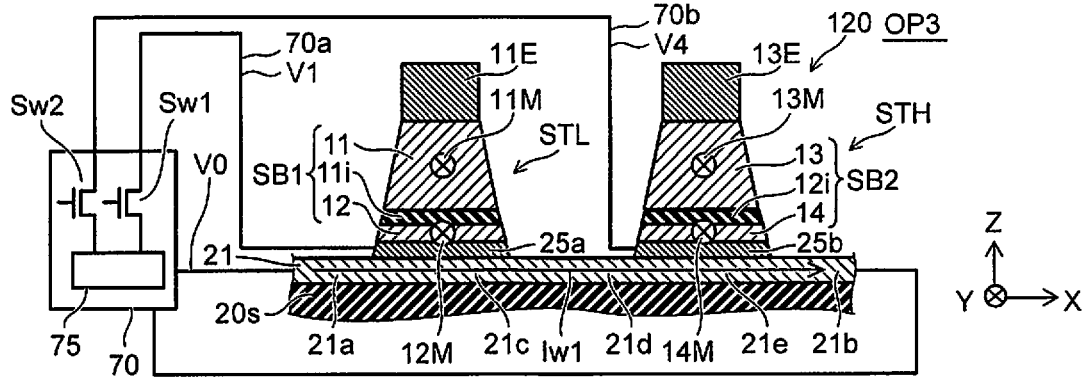
Figure 11D:
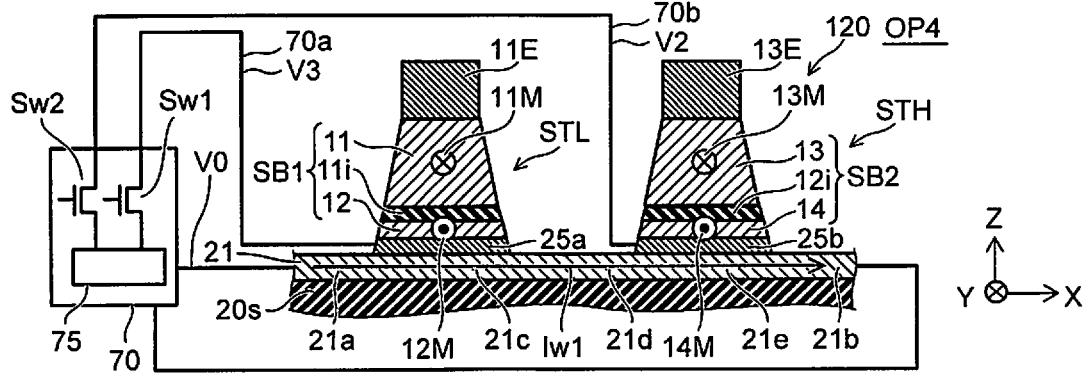

As shown in FIG. 11C and FIG. 11D, the controller 70 may further perform the third operation OP3 and the fourth operation OP4.

In the third operation OP3 as shown in FIG. 11C, the controller 70 supplies the third current Iw3 to the first member 21 from the first region 21a toward the second region 21b. In the third operation OP3, the controller 70 sets the first intermediate layer region 25a to the first electric potential V1 and sets the second intermediate layer region 25b to the fourth electric potential V4. The fourth current Iw4 may be the same as the third current Iw3.

In the fourth operation OP4, the controller 70 supplies the fourth current Iw4 to the first member 21 from the first region 21a toward the second region 21b. In the fourth operation OP4, the controller 70 sets the first intermediate layer region 25a to the third electric potential V3 and sets the second intermediate layer region 25b to the second electric potential V2.

For example, the fifth electrical resistance between the first intermediate layer region 25a and the first magnetic layer 11 after the third operation OP3 is lower than the second electrical resistance. The sixth electrical resistance between the second intermediate layer region 25b and the third magnetic layer 13 after the third operation OP3 is lower than the second electrical resistance. For example, after the third operation OP3, the first stacked body SB1 is in the first state STL (e.g., the low resistance state). After the third operation OP3, the second stacked body SB2 is in the first state STL.

For example, the seventh electrical resistance between the first intermediate layer region 25a and the first magnetic layer 11 after the fourth operation OP4 is higher than the first electrical resistance. The eighth electrical resistance between the second intermediate layer region 25b and the third magnetic layer 13 after the fourth operation OP4 is higher than the first electrical resistance. For example, after the fourth operation OP4, the first stacked body SB1 is in the second state STH (e.g., the high resistance state). After the fourth operation OP4, the second stacked body SB2 is in the second state STH.

As described above, the low resistance state and the high resistance state may be interchanged. Accordingly, in the embodiment, the absolute value of the difference between the third electrical resistance and the fifth electrical resistance between the first member 21 and the first magnetic layer 11 after the third operation OP3 is larger than the first absolute value (the absolute value of the difference between the first electrical resistance and the fourth electrical resistance) and larger than the second absolute value (the absolute value of the difference between the second electrical resistance and the third electrical resistance).

The absolute value of the difference between the second electrical resistance and the sixth electrical resistance between the first member 21 and the third magnetic layer 13 after the third operation OP3 is greater than the first absolute value and greater than the second absolute value.

The absolute value of the difference between the first electrical resistance and the seventh electrical resistance between the first member 21 and the first magnetic layer 11 after the fourth operation OP4 is greater than the first absolute value and greater than the second absolute value.

The absolute value of the difference between the fourth electrical resistance and the eighth electrical resistance between the first member 21 and the third magnetic layer 13 after the fourth operation OP4 is greater than the first absolute value and greater than the second absolute value.

Multiple stacked bodies are provided in the magnetic memory device 120 recited above. In the embodiment, operations such as the following may be performed in the case where one stacked body (e.g., the first stacked body SB1) is provided.

Even in such a case, the controller 70 performs at least the first operation OP1 and the second operation OP2. In the first operation OP1 as shown in FIG. 11A, the controller 70 supplies the first current Iw1 to the first member 21 from the first region 21a toward the second region 21b. In the first operation OP1, the controller 70 sets the first intermediate layer region 25a to the first electric potential ("V1" shown in FIGS. 1A and 1B) referenced to the electric potential V0 of the first member 21.

In the second operation OP2 as shown in FIG. 11B, the controller 70 supplies the second current Iw2 to the first member 21 from the first region 21a toward the second region 21b. In the second operation OP2, the controller 70 sets the first intermediate layer region 25a to the second electric potential ("V3" shown in FIG. 11B) referenced to the electric potential V0 of the first member 21. The second electric potential ("V3" shown in FIG. 11B) is different from the first electric potential ("V1" shown in FIG. 11A). The first electrical resistance between the first intermediate layer region 25a and the first magnetic layer 11 after the first operation OP1 is different from the second electrical resistance between the first intermediate layer region 25a and the first magnetic layer 11 after the second operation OP2.

Figure 12:
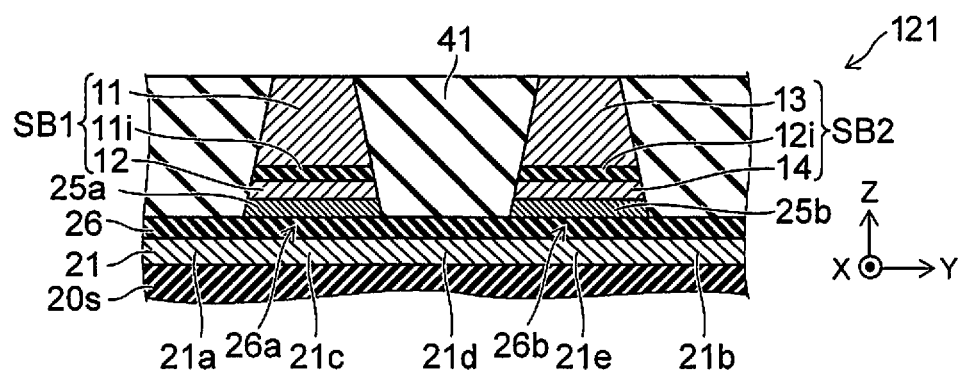
FIG. 12 is a schematic cross-sectional view illustrating a magnetic memory device according to the second embodiment.

FIG. 12 is a schematic cross-sectional view illustrating a magnetic memory device according to the second embodiment.

FIG. 12 is a cross-sectional view corresponding to line D1-D2 of FIG. 9A.

As shown in FIG. 12, the magnetic memory device 121 further includes the third intermediate layer region 26a and the fourth intermediate layer region 26b in addition to the first member 21, the first magnetic layer 11, the second magnetic layer 12, the first nonmagnetic layer 11i, the third magnetic layer 13, the fourth magnetic layer 14, the second nonmagnetic layer 12i, the first intermediate layer region 25a, and the second intermediate layer region 25b. The magnetic memory device 121 may further include the controller 70. The controller 70 is not illustrated in FIG. 12.

The third intermediate layer region 26a is provided between the third region 21c and the first intermediate layer region 25a. The third intermediate layer region 26a includes at least one selected from the group consisting of Mg, Al, and Ti and at least one selected from the group consisting of oxygen and nitrogen.

The fourth intermediate layer region 26b is provided between the fifth region 21e and the second intermediate layer region 25b. The fourth intermediate layer region 26b includes at least one selected from the group consisting of Mg, Al, and Ti and at least one selected from the group consisting of oxygen and nitrogen.

The third intermediate layer region 26a and the fourth intermediate layer region 26b include, for example, MgO. Electric fields can be applied effectively to the surface of the third region 21c and the surface of the fifth region 21e by providing the third intermediate layer region 26a and the fourth intermediate layer region 26b. More stable operations are obtained.

Examples of the first member 21, the first magnetic layer 11, the second magnetic layer 12, and the first nonmagnetic layer 11i will now be described. These descriptions are applicable to any example of the embodiments recited above. The following description relating to the first magnetic layer 11 is applicable to the third magnetic layer 13. The following description relating to the second magnetic layer 12 is applicable to the fourth magnetic layer 14. The following description relating to the first nonmagnetic layer 11i is applicable to the second nonmagnetic layer 12i.

The first member 21 includes, for example, Bi, Sb, and Te.

The second magnetic layer 12 includes, for example, at least one of a ferromagnetic material or a soft magnetic material. The second magnetic layer 12 may include, for example, an artificial lattice.

The second magnetic layer 12 includes, for example, at least one selected from the group consisting of FePd, FePt, CoPd, and CoPt. The soft magnetic material recited above includes, for example, CoFeB. The artificial lattice recited above includes, for example, a stacked film including a first film and a second film. The first film includes, for example, at least one of NiFe, Fe, or Co. The second film includes, for example, at least one of Cu, Pd, or Pt. The first film is, for example, a magnetic material; and the second film is a nonmagnetic material.

The first nonmagnetic layer 11i includes, for example, at least one selected from the group consisting of MgO, CaO, SrO, TiO, VO, NbO, and $Al_2O_3$. The first nonmagnetic layer 11i is, for example, a tunneling barrier layer. In the case where the first nonmagnetic layer 11i includes MgO, the thickness of the first nonmagnetic layer 11i is, for example, about 1 nm.

The first magnetic layer 11 includes, for example, at least one selected from Co and CoFeB.

The first magnetic layer 11 may include, for example, first to third films. The first film is provided between the third film and the first nonmagnetic layer 11i. The second film is provided between the first film and the third film. The first film includes, for example, a CoFeB film. The second film includes, for example, a Ru film. The third film includes, for example, a CoFeB film.

For example, at least one of the first magnetic layer 11 or the second magnetic layer 12 is an in-plane magnetization film. At least one of these magnetic layers may be a perpendicular magnetization film.

For example, a ferromagnetic or antiferromagnetic layer may be provided in the first stacked body SB1. The first magnetic layer 11 is provided between the layer and the first nonmagnetic layer 11i. The layer is, for example, an IrMn-layer. The layer fixes the first magnetization 11M of the first magnetic layer 11. A Ta layer may be provided on the layer.

Figure 13:
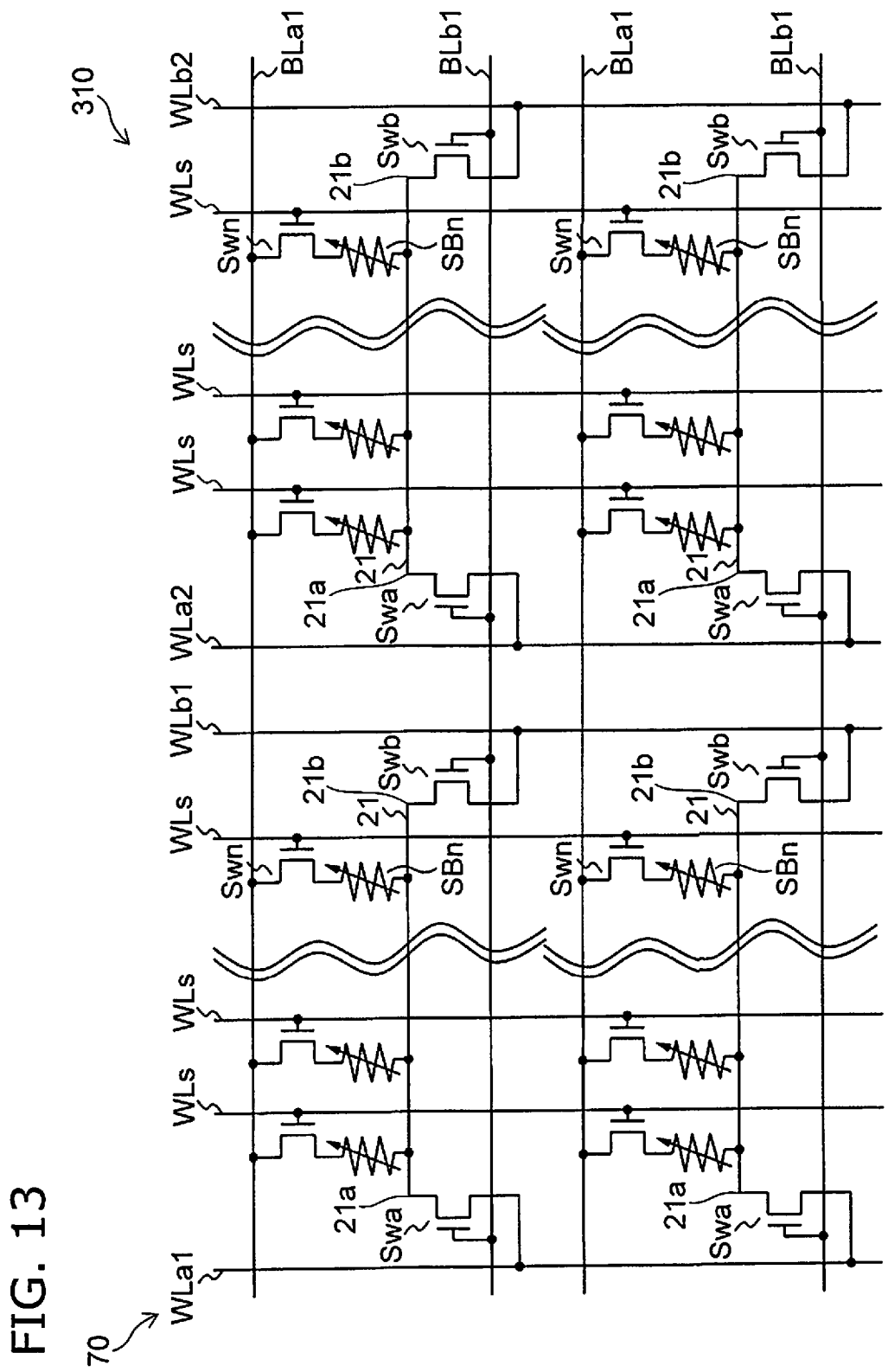
FIG. 13 is a schematic view showing a magnetic memory device according to the embodiment.

FIG. 13 is a schematic view showing a magnetic memory device according to the embodiment.

As shown in FIG. 13, multiple first interconnects (an interconnect WLa1 and an interconnect WLa2), multiple second interconnects (an interconnect WLb1 and an interconnect WLb2), multiple third interconnects (multiple interconnects WLs), multiple fourth interconnects (interconnects BLa1 and BLa2), and multiple fifth interconnects (interconnects BLb1 and BLb2) are provided in the magnetic memory device 310. For example, the multiple second interconnects are aligned with a direction in which the multiple first interconnects are aligned. For example, the multiple third interconnects are aligned with a direction in which the multiple first interconnects are aligned. The multiple third interconnects are provided between one of the multiple first interconnects and one of the multiple second interconnects.

For example, the multiple fifth interconnects are aligned with a direction in which the multiple fourth interconnects are aligned. The direction in which the multiple first interconnects, the multiple second interconnects, and the multiple third interconnects are aligned crosses the direction in which the multiple fourth interconnects and the multiple fifth interconnects are aligned.

The end (e.g., the first region 21a) of the first member 21 is connected to one terminal of a switch Swa. Another terminal of the switch Swa is connected to the interconnect WLa1. Another end (e.g., the second region 21b) of the first member 21 is connected to one terminal of a switch Swb. Another terminal of the switch Swb is connected to the interconnect WLb1.

The ends of the multiple stacked bodies SBn each are connected to the first member 21. The other ends of the multiple stacked bodies SBn are connected respectively to one terminal of each of switches Swn. One terminal of the switch Swn is connected to the interconnect BLa1.

The gates of the switch Swa and the switch Swb are connected to the interconnect BLb1. The gates of the switches Swn (the multiple switches) are connected to one of the multiple third interconnects (the multiple interconnects WLs).

The multiple first members 21 are provided to correspond to the multiple first to fifth interconnects. For example, the multiple first members 21 can be selected by operating the switch Swa and the switch Swb using the interconnect BLb1 (and the interconnect BLb2). For the selected first member 21, the desired voltage is applied to the multiple stacked bodies SBn by operating the switch Swn using the interconnect WLs.

For example, the first information or the second information is programmed by applying different voltages to the multiple stacked bodies SBn.

A characteristic (an electrical resistance, a current, or a voltage) that corresponds to the electrical resistance of each of the multiple stacked bodies SBn can be detected by the operations of the various switches recited above. Thereby, the programmed information is read. At least a portion of the various switches recited above may be included in the controller 70.

According to the embodiments, a magnetic memory device can be provided in which more stable operations are obtained. In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies. The "state of being electrically connected" includes the state in which an electrical element (a switch such as a transistor or the like) is inserted between multiple conductive bodies so that a state is formable in which a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as first members, magnetic layers, nonmagnetic layers, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
    a first member including a first region, a second region, and a third region between the first region and the second region;
    a first memory cell including a first magnetic layer, a second magnetic layer, and a first nonmagnetic layer, the second magnetic layer being provided between the third region and the first magnetic layer in a first direction crossing a second direction, the second direction being from the first region toward the second region, the first nonmagnetic layer being provided between the first magnetic layer and the second magnetic layer; and a controller electrically connected to the first region, the second region, and the first magnetic layer, the controller being configured to program first information to the first memory cell by setting the first magnetic layer to a first electric potential while supplying a first current to the first member from the first region toward the second region, the controller being configured to program second information to the first memory cell by setting the first magnetic layer to a second electric potential while supplying the first current to the first member, the second electric potential being different from the first electric potential, the second information being different from the first information, a length of the first magnetic layer along the second direction being shorter than a length of the second magnetic layer along the second direction.

2. The device according to claim 1, further comprising a second memory cell, the first member further including a fourth region and a fifth region, the fourth region being between the third region and the second region, the fifth region being between the fourth region and the second region, the second memory cell including
a third magnetic layer,
a fourth magnetic layer provided between the fifth region and the third magnetic layer in the first direction, and
a second nonmagnetic layer provided between the third magnetic layer and the fourth magnetic layer, the controller being further electrically connected to the third magnetic layer, the controller being configured to program the first information to the second memory cell by setting the third magnetic layer to a third electric potential while supplying the first current to the first member, the controller being configured to program the second information to the second memory cell by setting the third magnetic layer to a fourth electric potential while supplying the first current to the first member, the fourth electric potential being different from the third electric potential.

3. The device according to claim 2, further comprising a first intermediate layer including at least one selected from the group consisting of Cu, Ag, Al, Au, and Ir, a first intermediate layer region of the first intermediate layer being provided between the third region and the second magnetic layer, a second intermediate layer region of the first intermediate layer being provided between the fifth region and the fourth magnetic layer.

4. The device according to claim 3, wherein the first intermediate layer region is separated from the second intermediate layer region.

5. The device according to claim 3, wherein a thickness along the first direction of the first intermediate layer is not less than 0.5 nm and not more than 20 nm.

6. The device according to claim 3, further comprising a second intermediate layer including at least one selected from the group consisting of Mg, Al, and Ti and at least one selected from the group consisting of oxygen and nitrogen, a third intermediate layer region of the second intermediate layer being provided between the first intermediate layer region and the second magnetic layer or provided between the first intermediate layer region and the third region, a fourth intermediate layer region of the second intermediate layer being provided between the second intermediate layer region and the fourth magnetic layer or between the second intermediate layer region and the fifth region.

7. The device according to claim 6, wherein a length of second intermediate layer along the second direction being longer than the length of the second magnetic layer along the second direction.

8. The device according to claim 3, wherein a length of the first intermediate layer along the second direction being longer than the length of the second magnetic layer along the second direction.

9. The device according to claim 3, wherein a length of the first intermediate layer along the second direction being longer than the length of the second magnetic layer along the second direction.

10. The device according to claim 1, further comprising a first intermediate layer including at least one selected from the group consisting of Cu, Ag, Al, Au, and Ir, a first intermediate layer region of the first intermediate layer being provided between the third region and the second magnetic layer.

11. The device according to claim 1, wherein the first member includes Bi, Sb, and Te.

12. The device according to claim 1, wherein the first member includes $(BiSb)_2Te_3$.

* * * * *